(12) United States Patent
Miettinen

(10) Patent No.: US 7,446,268 B2
(45) Date of Patent: Nov. 4, 2008

(54) LEAD-THROUGH COMPONENT AND METHOD

(75) Inventor: Erkki Miettinen, Helsinki (FI)

(73) Assignee: ABB Oy, Helsinki (FI)

( * ) Notice: Subject to any disclaimer, the term of this patent is extended or adjusted under 35 U.S.C. 154(b) by 35 days.

(21) Appl. No.: 11/639,260

(22) Filed: Dec. 15, 2006

(65) Prior Publication Data

US 2007/0137876 A1    Jun. 21, 2007

(30) Foreign Application Priority Data

Dec. 20, 2005    (FI) ................................. 20055682

(51) Int. Cl.
*H02G 3/18* (2006.01)

(52) U.S. Cl. .................... 174/650; 174/668; 16/2.1; 439/604

(58) Field of Classification Search ........... 174/650, 174/660, 656, 659, 668, 663, 152 G, 153 G, 174/142, 151, 152 R, 362, 657; 248/56, 248/68.1; 16/2.1, 2.2; 439/604, 587, 275
See application file for complete search history.

(56) References Cited

U.S. PATENT DOCUMENTS

| 3,423,518 | A | 1/1969 | Weagant | |
|---|---|---|---|---|
| 6,278,061 | B1 | 8/2001 | Hage | |
| 6,951,984 | B2 * | 10/2005 | Buchberger | 174/360 |
| 7,262,372 | B2 * | 8/2007 | Ickert | 174/650 |
| 7,282,650 | B2 * | 10/2007 | Czuhanich et al. | 174/659 |
| 7,288,730 | B2 * | 10/2007 | Habel et al. | 174/650 |

FOREIGN PATENT DOCUMENTS

| DE | 2100940 A | 1/1983 |
|---|---|---|
| EP | 0238203 A2 | 9/1987 |
| EP | 0402046 A2 | 12/1990 |

* cited by examiner

*Primary Examiner*—Dhiru R Patel
(74) *Attorney, Agent, or Firm*—Buchanan Ingersoll & Rooney PC

(57) ABSTRACT

This invention relates to a lead-through component for a cable. To achieve a lead-through component suitable for cables having a large diameter, the lead-through component includes a shrinkable sleeve that is to be threaded onto a lead-through bushing and whose inner surface is provided with a conductive material layer that comes into contact with the lead-through bushing, the shrinkable sleeve being shrinkable by heating to adhere to the lead-through bushing and to a cable threaded through the lead-through bushing.

9 Claims, 2 Drawing Sheets

LEAD-THROUGH COMPONENT AND METHOD

FIELD OF THE INVENTION

The present invention relates to a solution for accomplishing a cable lead-through particularly for cables having a large diameter.

DESCRIPTION OF THE RELATED ART

In practice, the lead-through of high-frequency signal cables in particular, such as motor cables of frequency converters, into a cabinet or a casing is problematic. Sufficient sealing in view of the environment (IP protection) and also sufficient protection against electromagnetic emission (EMC) have to be taken into account in the lead-through. Various ready-made lead-through fittings are available for small cable diameters, but for large cables whose lead-through components require not only the above-described properties, but also effective draught elimination, adequately operating lead-through components are not available.

Another problem associated with lead-through components is that the diameters of interface cables of a high-power frequency converter may be 55 mm (millimeters) while the width of the casing of the frequency converter is only 200 mm (millimeters). Accordingly, there is not much space for the lead-through component of the cable, and it should therefore have a structure that does not require much space in the wall in which it is installed.

SUMMARY OF THE INVENTION

An object of the present invention is to achieve a solution that is suitable particularly for implementing a lead-through for cables having a large diameter.

The invention utilizes a combination of an electrically conductive lead-through bushing and a shrinkable sleeve to accomplish an effective lead-through. A conductive material layer arranged on the inner surface of the shrinkable sleeve comes into contact with the conductive lead-through bushing that is fastened to a wall and with the cable. This results in efficient EMC protection at the lead-through point. By heating, the shrinkable sleeve is sealed against the cable, resulting in effective IP protection in addition to draught elimination.

Preferred embodiments of the method and lead-through component of the invention are described below.

BRIEF DESCRIPTION OF FIGURES

In the following, the invention will be described by way of example with reference to the accompanying figures, of which

DESCRIPTION OF SOME EMBODIMENTS

Figure 1:
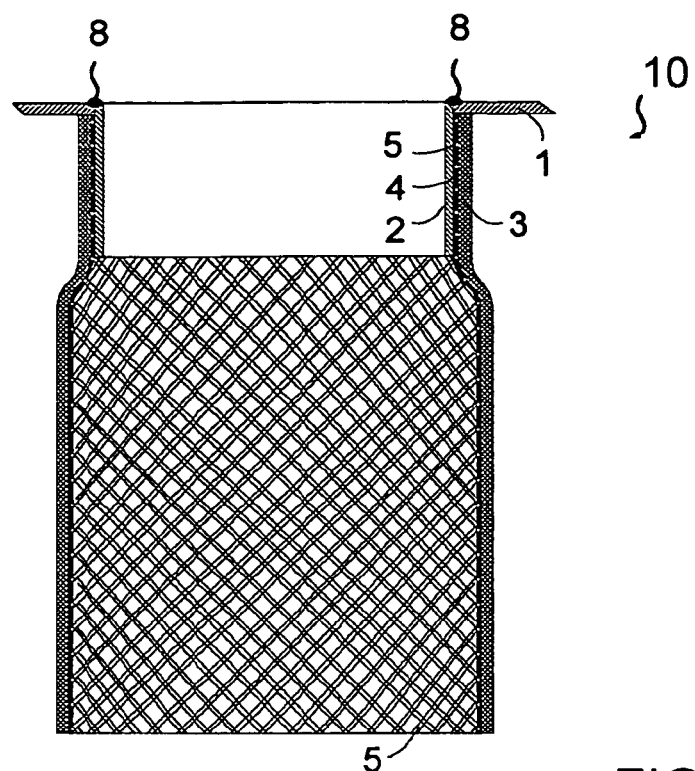
FIG. 1 illustrates a first preferred embodiment of the lead-through component and the method of the invention.

FIG. 1 illustrates a first preferred embodiment of the lead-through component 10 and the method of the invention. FIG. 1 shows the cable lead-through in section.

A wall 1, through which a cable is led, may be the metal wall of an electric installation cabinet, for example. In the case of FIG. 1, a metal lead-through bushing 2 is fastened to the wall by welding 8. In practice, the welding may be implemented by TIG-(Tungsten Inert Gas), MIG-(Metal Inert Gas) or friction welding, for example. For example, a steel sleeve may be concerned, which is dimensioned suitable on the basis of the diameter of the cable to be used, i.e. to allow the cable to be threaded through. Depending of the diameter, the practical length of the lead-through bushing may be about 20 to 30 mm. For the elimination of any problems caused by corrosion, at least the exterior surface of the lead-through bushing 2 is zinc electroplated. In accordance with the invention, the lead-through bushing does not have to be a separate sleeve fastened to the wall, it may also be of the same material as the wall 1. This being so, it may be manufactured directly by extrusion from the wall material, for example.

A shrinkable sleeve 3 to be threaded onto the lead-through bushing 2 may be made from polyolefin. This allows the shrinkable sleeve 3 to be dimensioned for instance in such a manner that its length is 50 to 100 mm depending on the diameter, and its wall thickness about 2 to 3 mm after the shrinkage.

In accordance with the invention, an electrically conductive material layer 5 is arranged on the interior surface of the shrinkable sleeve 3. In the case of FIG. 1, the assumption is, by way of example that said material layer 5 is composed of metal particles mixed with an adhesive layer 4 applied onto the interior surface or of metal threads. However, in accordance with the invention, it is feasible that the material layer 5 is composed of a metal mesh that is held in position by the adhesive layer 4, or, alternatively, of a metal mesh that is separate with regard to the shrinkable sleeve. However, to accomplish optimal EMC protection, it is desirable for the electrically conductive material layer 5 to enclose the cable all along the 360° range.

Depending on the cable material to be used, any adhesive layer 4 to be arranged onto the interior surface of the shrinkable sleeve is preferably selected such that it provides a good adhesion to the cable and the lead-through bushing 2 when the shrinkable sleeve is heated for reducing its diameter. A glue line may be involved, which is activated by heating, and adheres to the cable and the lead-through bushing. Should the material in the cable with which the adhesive layer 4 comes into contact be PVC (Polyvinyl Chloride)or XLPE (Crossed-linked Polyethylene), for example, the adhesive layer 4 may be hot melt adhesive, for example. The use of an adhesive layer 4 brings the advantage of the cable lead-through becoming more rigid, whereby it operates more effectively as a draught eliminator, and also seals the contact surfaces between the cable, the lead-through bushing and the shrinkable sleeve in a manner enhancing the IP protection of the structure against dust and water.

At least the lead-through bushing 2 can be fastened to the wall of the cable cabinet during manufacture of the cable cabinet. Such a cable cabinet may be delivered to the client together with a suitably dimensioned shrinkable sleeve including electrically conductive material layer (as a fixed component with the shrinkable sleeve or as a component separate from it). In this case, in connection with the electric installation the lead-through may be implemented for instance with a fan heater, with which a first end of the shrinkable sleeve 3 threaded onto the lead-through bushing 2 is heated for shrinking it and for activating any adhesive layer 4 in such a manner that the shrinkable sleeve adheres to the lead-through bushing. The cable is then peeled and threaded through the shrinkable sleeve. Finally, a second end of the shrinkable sleeve is heated in such a manner that it adheres to the cable by shrinkage (or by means of any adhesive layer).

It is also feasible not to fasten the lead-through bushing to the cable cabinet in connection with the manufacture, but it is delivered, together with the shrinkable sleeve, as a separate delivery to the installation site, where the implementation of the lead-through is initiated by fastening the lead-through bushing to the wall of the cable cabinet.

It is further feasible that the lead-through bushing 2 is fastened to the wall of the cable cabinet during manufacture, in addition to which the shrinkable sleeve 3 is fastened at its first end onto the lead-through bushing. This being so, in the actual electric installation it is sufficient to thread the cable through the lead-through bushing and the shrinkable sleeve, after which the second end of the shrinkable sleeve is heated with a fan heater in order to complete the cable lead-through.

Figure 2:
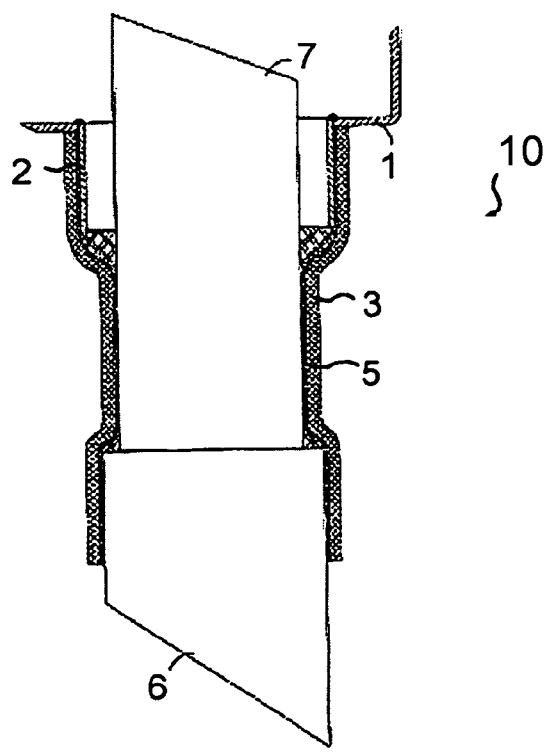
FIGS. 2 to 4 illustrate alternative manners of installation of the lead-through component of the invention.
Figure 3:
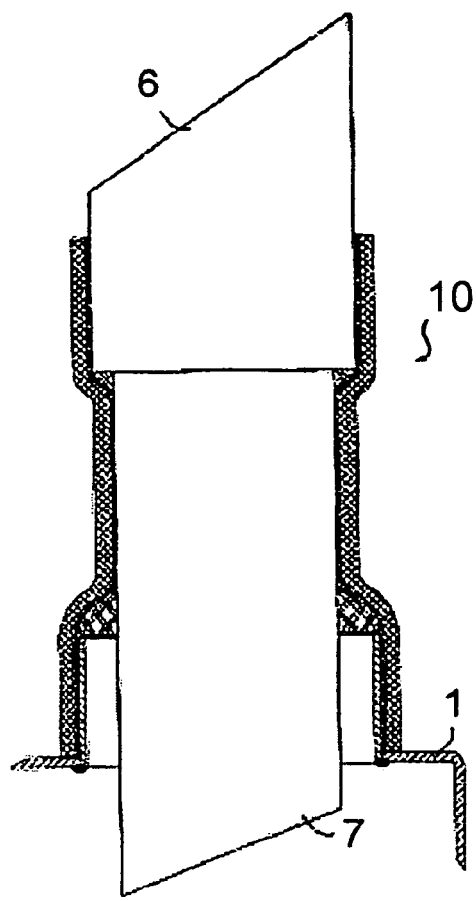
Figure 4:
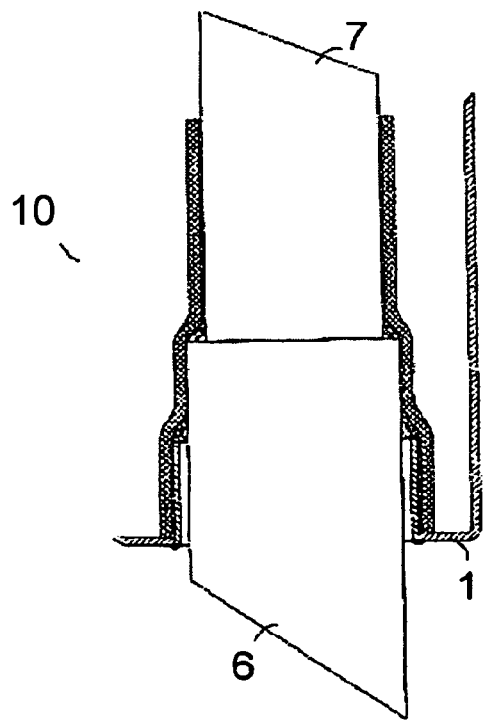

FIGS. 2 to 4 illustrate alternative manners of installation of the lead-through component 10 of the invention.

FIG. 2 shows a cable lead-through from the lower surface of an electric cabinet or box. The wall 1 to be pierced thus constitutes the bottom of the cabinet. FIG. 2 shows that the cable has been peeled for removing part of its exterior mantle 6. The concentric cover 7 of the cable, which in this example is composed of electrically conductive wire or film structures, has thus come into contact with a conductive material layer 5 arranged on the interior surface of the shrinkable sleeve 3. This metal layer 5, in turn, is in contact with the electrically conductive lead-through bushing 2, which means that the concentric cover has come into an electric contact with the wall 1. This enables a 360° electrical contact with the interior surface of the lead-through component, resulting in an optimally efficient EMC protection.

The case in FIG. 3 corresponds to that of FIG. 2 to a great degree. However, in the case of FIG. 3, a lead-through component arranged outside the upper surface of an electric cabinet is involved. In this case, the wall 1 is composed of the top of the electric cabinet.

The case in FIG. 4 corresponds to that of FIG. 2 to a great degree. However, in the case of FIG. 4, a lead-through component arranged inside the lower surface of an electric cabinet is involved. In this case, the wall 1 is composed of the bottom of the electric cabinet.

It is to be understood that the above specification and the related figures are only intended to illustrate the present invention. Different variations and modifications of the invention will be apparent to those skilled in the art, without deviating from the scope of the invention.

The invention claimed is:

1. A method of implementing a cable lead-through passing through a wall, the method comprising: threading the cable through a lead-through bushing and a shrinkable sleeve comprising on an inside an electrically conductive material layer and an adhesive layer, a first end of the shrinkable sleeve being fastened to the lead-through bushing, and heating a second end of the shrinkable sleeve to reduce the diameter of the second end of the shrinkable sleeve and to fasten the shrinkable sleeve to the cable.

2. The method of claim 1, further comprising arranging a first end of said shrinkable sleeve on top of the electrically conductive lead-through bushing, and heating the first end of the shrinkable sleeve to reduce the diameter of the shrinkable sleeve and to fasten the first end to the lead-through bushing.

3. The method of claim 1, further comprising applying an adhesive layer containing metal particles or metal wires onto an interior surface of the shrinkable sleeve to form said electrically conductive material layer and the adhesive layer.

4. The method of claim 1, further comprising arranging a separate metal mesh inside the shrinkable sleeve to form said electrically conductive material layer.

5. The method of claim 1, further comprising fastening the lead-through bushing to the wall by welding.

6. A cable lead-through component comprising:
a shrinkable sleeve to be threaded onto a lead-through bushing, the shrinkable sleeve being shrinkable by heating for connecting the lead-through component to the lead-through bushing and to a cable threaded through the lead-through bushing;
an electrically conductive material layer arranged inside the shrinkable sleeve the electrically conductive material layer being in contact with the lead-through bushing; and
an adhesive layer arranged inside the shrinkable sleeve.

7. The lead-through component of claim 6, wherein the electrically conductive material layer and the adhesive layer arranged inside the shrinkable sleeve are composed of the adhesive layer containing metal particles or metal wires.

8. The lead-through component of claim 6, wherein said electrically conductive material layer arranged inside the shrinkable sleeve is composed of a separate metal mesh arranged inside the shrinkable sleeve.

9. The lead-through component of claim 6, wherein said adhesive layer can be activated by heating for adherence to the lead-through bushing, to a cable threaded through the lead-through bushing or to the lead-through bushing and the cable.

* * * * *